(12) United States Patent  (10) Patent No.: US 8,493,105 B2
Chang et al.  (45) Date of Patent: Jul. 23, 2013

(54) INJECTION-LOCKED FREQUENCY DIVIDER

(75) Inventors: Hong-Yeh Chang, New Taipei (TW);
Yen-Liang Yeh, Taoyuan County (TW);
Chia-Hung Chang, Chiayi County (TW); Chun-Jen Chen, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 30 days.

(21) Appl. No.: 13/339,361

(22) Filed: Dec. 28, 2011

(65) Prior Publication Data

US 2013/0093475 A1  Apr. 18, 2013

(30) Foreign Application Priority Data

Oct. 14, 2011 (TW) ............................... 100137348 A

(51) Int. Cl.
*H03B 19/06*  (2006.01)
(52) U.S. Cl.
USPC ............................ 327/118; 327/115; 377/48
(58) Field of Classification Search
USPC ........................ 327/115, 117, 118; 377/47, 48
See application file for complete search history.

(56) References Cited

U.S. PATENT DOCUMENTS

| 4,608,539 A | * | 8/1986 | Lawton | 329/318 |
|---|---|---|---|---|
| 4,806,872 A | * | 2/1989 | Cowley | 329/344 |
| 7,522,007 B2 | | 4/2009 | Jang et al. | |
| 7,522,008 B2 | | 4/2009 | Jang et al. | |
| 7,557,664 B1 | | 7/2009 | Wu | |
| 7,557,668 B2 | | 7/2009 | Jang et al. | |
| 7,656,205 B2 | | 2/2010 | Chen et al. | |
| 7,667,505 B2 | | 2/2010 | Roine | |
| 7,671,640 B2 | | 3/2010 | Lee et al. | |
| 7,671,641 B1 | | 3/2010 | Acar et al. | |
| 7,680,238 B2 | | 3/2010 | Lin | |
| 7,683,681 B2 | | 3/2010 | Jang et al. | |

(Continued)

FOREIGN PATENT DOCUMENTS

| TW | I233728 | 6/2005 |
|---|---|---|
| TW | 200537815 | 11/2005 |

(Continued)

OTHER PUBLICATIONS

R. Magoon et al., "RF local oscillator path for GSM direct conversion transceiver with true 50% duty cycle divide by three and active third harmonic cancellation," IEEE Radio Frequency Integrated Circuits Symposium, 2002, pp. 23-26.

(Continued)

*Primary Examiner* — William Hernandez
(74) *Attorney, Agent, or Firm* — Jianq Chyun IP Office

(57) ABSTRACT

An injection-locked frequency divider (ILFD) including a signal injector, an oscillator (OSC), and a buffer stage is provided. The signal injector is configured for receiving an injection signal. The OSC is configured for dividing the frequency of the injection signal, so as to generate a first divided frequency signal, where there is an integral-multiple relation between the frequency of the first divided frequency signal and that of the injection signal. The buffer stage is configured for receiving and boosting the first divided frequency signal, and performing a push-push process on the first divided frequency signal, so as to output a second divided frequency signal, where there is a fractional-multiple relation between the frequency of the second divided frequency signal and that of the injection signal.

11 Claims, 3 Drawing Sheets

U.S. PATENT DOCUMENTS

| | | | |
|---|---|---|---|
| 7,683,729 B2 | 3/2010 | Mansuri et al. | |
| 7,705,686 B2 | 4/2010 | Jang et al. | |
| 7,710,211 B2 | 5/2010 | Jang et al. | |
| 7,719,327 B2 | 5/2010 | Tsai | |
| 7,734,001 B2 | 6/2010 | Saeki | |
| 7,737,738 B2 | 6/2010 | Acar et al. | |
| 7,750,693 B2 | 7/2010 | Chu et al. | |
| 7,782,101 B2 | 8/2010 | Jang et al. | |
| 8,305,116 B2 * | 11/2012 | Jang et al. | 327/115 |
| 2011/0050296 A1 * | 3/2011 | Fagg | 327/118 |
| 2012/0068745 A1 * | 3/2012 | Hsieh et al. | 327/157 |

FOREIGN PATENT DOCUMENTS

| | | |
|---|---|---|
| TW | 200814531 | 3/2008 |
| TW | 200816617 | 4/2008 |
| TW | 200835134 | 8/2008 |
| TW | 200840226 | 10/2008 |
| TW | 200845591 | 11/2008 |
| TW | 200849825 | 12/2008 |
| TW | 200908560 | 2/2009 |
| TW | 200915722 | 4/2009 |
| TW | 200919943 | 5/2009 |
| TW | 200919977 | 5/2009 |
| TW | 200934136 | 8/2009 |
| TW | 200937836 | 9/2009 |
| TW | 200943731 | 10/2009 |

OTHER PUBLICATIONS

S. C. Tseng et al., "SSH and SHH GaInP/GaAs HBT divide-by-3 prescalers with true 50% duty cycle," Electronics Letters 6th, vol. 42, No. 14, Jul. 2006, pp. 1-2.

W. Z. Chen et al., "18 GHz and 7 GHz superharmonic injection-locked frequency dividers in 0.25 μm CMOS technology", ESSCIRC, 2002, pp. 89-92.

X. P. Yu et al., "Sub-1 V low power wide range injection-locked frequency divider," IEEE Microw.Wireless Compon. Lett., vol. 17, No. 7, Jul. 2007, pp. 528-530.

M. Motoyoshi et al., "43 μw 6 GHz CMOS divide-by-3 frequency divider based on three-phase harmonic injection locking", IEEE, 2006, pp. 183-186.

H. Wu et al., "A 16-to-18 GHz 0.18 mm Epi-CMOS divide-by-3 injection-locked frequency divider", IEEE International Solid-State Circuits Conference, 2006, Session 32, PLLs, VCOs, and Dividers, 32.9, pp. 1-10.

T. N. Luo et al., "A 60-GHz 0.13-mm CMOS Divide-by-Three Frequency Divider", IEEE Transactions on Microwave Theory and Techniques, vol. 56, No. 11, Nov. 2008, pp. 2409-2415.

M. Motoyoshi et al., "58.8/39.2 GHz dual-modulus CMOS frequency divider with 9.2 × 5.2 μm core size", Electronics Letters, 18th, vol. 43, No. 2, Jan. 2007, pp. 1-2.

H. M. Cheema et al., "A dual-mode mm-wave injection-locked frequency divider with greater than 18% locking range in 65nm CMOS", IEEE, 2010, pp. 780-783.

H. K. Chen et al., "A mm-wave CMOS multimode frequency divider ", IEEE International Solid-State Circuits Conference, 2009, Session 16, High-Speed mm-Wave Circuits, 16.4, pp. 1-3.

S. Lim et al., "A 110GHz inductor-less CMOS frequency divider", IEEE Asian Solid-State Circuits Conference, Nov. 16-18, 2009, pp. 61-64.

C. H. Wang et al., "A66-72 GHz Divide-by-3 Injection-Locked Frequency Divider in 0.13-μm CMOS Technology", IEEE Asoam Sp;od-State Circuits Conference, Nov. 12-14, 2007, pp. 344-347.

T. N. Luo et al., "A 43 GHz 0.13μm CMOS Prescaler", IEEE, RWS, 2008, pp. 179-182.

T. N. Luo et al., "77 GHz CMOS injection-locked Miller frequency divider", Electronics Letters, vol. 45, No. 1, Jan. 1, 2009, pp. 1-2.

S. L. Jang et al., "A 90 nm CMOS LC-Tank Divide-by-3 Injection-Locked Frequency Divider With Record Locking Range", IEEE Microwave and Wireless Components Letters, vol. 20, No. 4, Apr. 2010, pp. 229-231.

* cited by examiner

INJECTION-LOCKED FREQUENCY DIVIDER

CROSS-REFERENCE TO RELATED APPLICATION

This application claims the priority benefit of Taiwan application serial no. 100137348, filed Oct. 14, 2011. The entirety of the above-mentioned patent application is hereby incorporated by reference herein and made a part of this specification.

BACKGROUND

1. Technical Field

The disclosure relates to a frequency divider, and more particularly, to an injection-locked frequency divider (ILFD).

2. Related Art

Frequency divider plays a role in a phase-locked loop (PLL), and is also a critical circuit in a wireless communication system. The maximal working frequency of the PLL is generally limited by an operating frequency range of a first-stage frequency divider. However, existing frequency dividers may be generally classified into three types, namely, current mode logic (CML) frequency dividers, ILFDs, and regenerative frequency dividers.

Generally, the CML frequency divider has a good sensitivity and bandwidth, but the operating frequency is not high due to the limitation by a current gain cut-off frequency (ft) of the element. Although the working frequency of the regenerative frequency divider is higher than that of the CML frequency divider, may result in excessive consumption of direct current (DC) power. The ILFD has a low DC power consumption and high operating frequency; however, the range of injection-locking is narrower, and thus is not suitable for current wireless communication applications requiring high data transfer rate and low DC power consumption.

SUMMARY

An ILFD including a signal injector, an oscillator (OSC), and a buffer stage is introduced herein. The signal injector is configured for receiving an injection signal. The OSC is configured for dividing the frequency of the injection signal, so as to generate a first divided frequency signal, where there is an integral-multiple relation between the frequency of the first divided frequency signal and that of the injection signal. The buffer stage is configured for receiving and boosting the first divided frequency signal, and performing a push-push process on the first divided frequency signal, so as to output a second divided frequency signal, where there is a fractional-multiple relation between the frequency of the second divided frequency signal and that of the injection signal.

An ILFD is further introduced herein, which is configured for receiving an injection signal, dividing the frequency of the injection signal, so as to generate a first divided frequency signal, and performing a push-push process on the first divided frequency signal, so as to output a second divided frequency signal. There is an integral-multiple relation between the frequency of the first divided frequency signal and that of the injection signal; and there is a fractional-multiple relation between the frequency of the second divided frequency signal and that of the injection signal.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
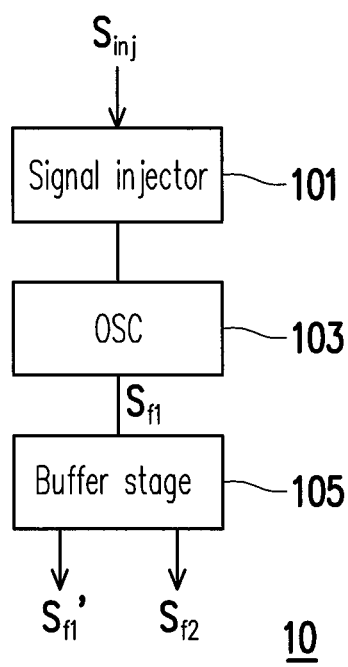
FIG. 1 is a schematic diagram illustrating an ILFD 10 according to an exemplary embodiment.

Reference will now be made in detail to the exemplary embodiments of the disclosure, examples of which are illustrated in the accompanying drawings. Wherever possible, the same reference numbers are used in the drawings and the description to refer to the same or like parts.

FIG. 1 is a schematic diagram illustrating an ILFD 10 according to an exemplary embodiment. Referring to FIG. 1, the ILFD 10 includes a signal injector 101, an oscillator (OSC) 103, and a buffer stage 105. The signal injector 101 is configured for receiving an injection signal $S_{inj}$. The OSC 103 is configured for dividing the frequency of the injection signal $S_{inj}$, so as to generate a first divided frequency signal $S_{f1}$, where there is an integral-multiple relation between the frequency of the first divided frequency signal $S_{f1}$ and that of the injection signal $S_{inj}$.

The buffer stage 105 is configured for receiving and boosting the first divided frequency signal $S_{f1}$ (that is, a boosted first divided frequency signal $S_{f1}'$), and performing a push-push process on the first divided frequency signal $S_{f1}$, so as to output a second divided frequency signal $S_{f2}$, where there is a fractional-multiple relation between the frequency of the second divided frequency signal $S_{f2}$ and that of the injection signal $S_{inj}$. It should be noted that the ILFD 10 of the exemplary embodiment may generate a dual-mode output (that is, the boosted first divided frequency signal $S_{f1}'$, and the second divided frequency signal $S_{f2}$) in response to the same input frequency (that is, the injection signal $S_{inj}$), thereby enlarging the application range of the ILFD 10.

Moreover, there may be a fractional-multiple relation (for example, decimal-multiple relation) between the frequency of one mode of output (that is, the second divided frequency signal $S_O$) and that of the input frequency (that is, the injection signal $S_{inj}$), so that the ILFD 10 may be applied in a phase-locked loop (PLL) and/or a frequency synthesizer with a decimal divisor; however, the disclosure is not limited thereto.

Figure 2:
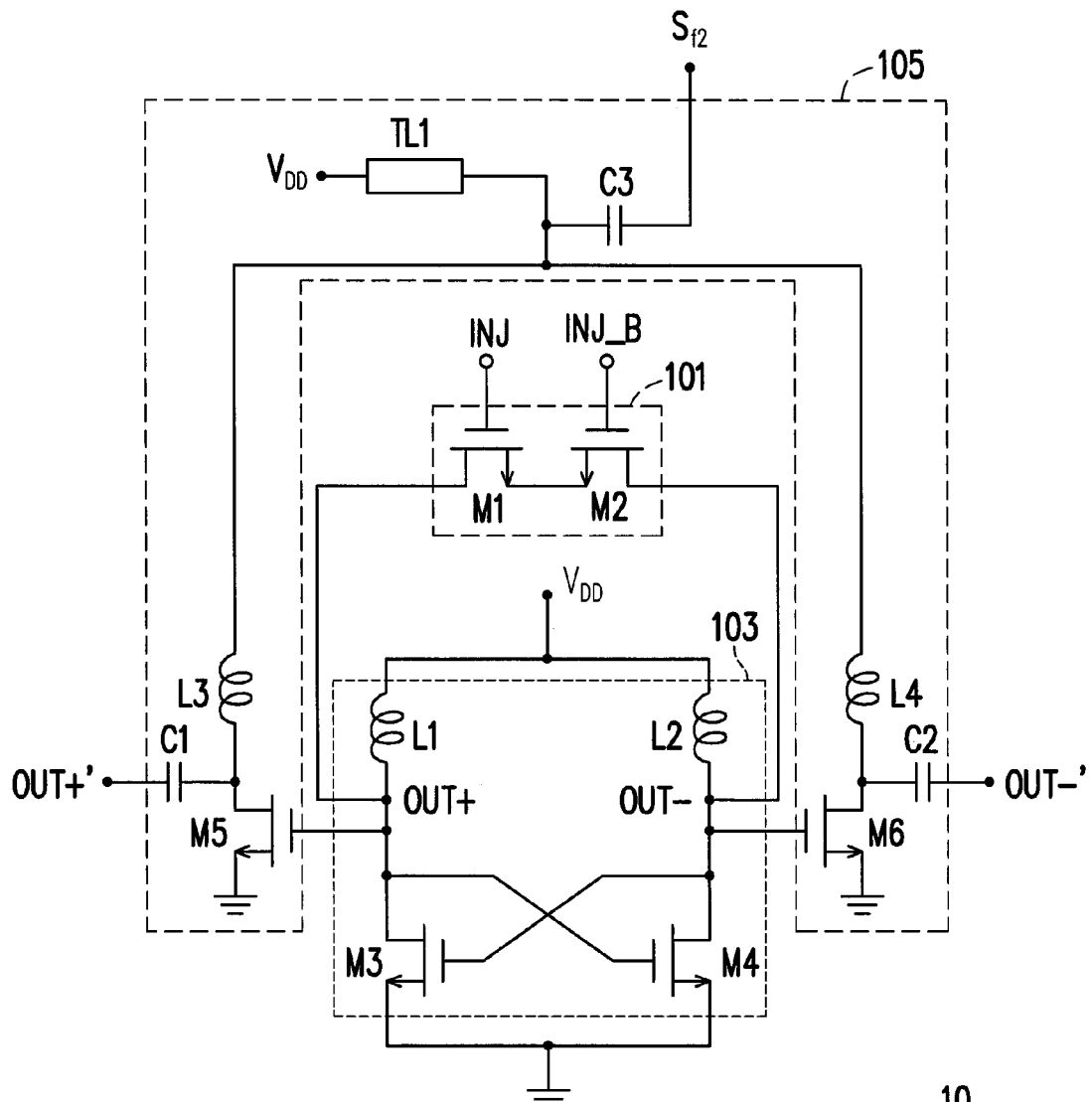
FIG. 2 is a detailed circuit diagram illustrating the ILFD 10 of FIG. 1.

Specifically, FIG. 2 is a detailed circuit diagram illustrating the ILFD 10 of FIG. 1. Referring to FIGS. 1 and 2, the injection signal $S_{inj}$ received by the signal injector 101 may be a differential injection signal, wherein the differential injection signal may have a first injection signal INJ and a second injection signal INJ_B. Accordingly, the signal injector 101 may include transistors M1 and M2. The transistors M1 and M2 may both be implemented by N-type transistors, and the size ratio of the transistors M1 and M2 may be any multiple. A gate of the transistor M1 is configured for receiving the first injection signal INJ; a gate of the transistor M2 is configured for receiving the second injection signal INJ_B; and a source of the transistor M2 is coupled to a source of the transistor M1. In the exemplary embodiment, by directly injecting the differential injection signal (INJ, INJ_B) into the transistors M1 and M2, a second harmonic component may be enhanced, thereby enlarging the locking range of the ILFD 10.

In addition, the first divided frequency signal $S_{f1}$ output from the OSC 103 may be a differential divided frequency signal, wherein the differential divided frequency signal may have a positive divided frequency signal OUT+ and a negative divided frequency signal OUT−. Accordingly, the OSC 103 may include inductors L1 and L2 and transistors M3 and M4, wherein the transistors M3 and M4 may both be implemented by N-type transistors. A first end of the inductor L1 is coupled to an operating voltage $V_{DD}$, and a second end of the inductor L1 is coupled to a drain of the transistor M1, so as to output the positive divided frequency signal OUT+.

A first end of the inductor L2 is coupled to the operating voltage $V_{DD}$, and a second end of the inductor L2 is coupled to a drain of the transistor M2, so as to output the negative divided frequency signal OUT−. A gate of the transistor M3 is coupled to the second end of the inductor L2, a drain of the transistor M3 is coupled to the second end of the inductor L1, and a source of the transistor M3 is coupled to a ground potential. A gate of the transistor M4 is coupled to the second end of the inductor L1, a drain of the transistor M4 is coupled to the second end of the inductor L2, and a source of the transistor M4 is coupled to the ground potential.

In the exemplary embodiment, the inductors L1 and L2, and parasitic capacitances of the transistor M3 and M4 cause the OSC 103 to be an inductance-capacitance (LC) OSC. Moreover, the transistors M3 and M4 provide a negative resistance by a means of cross-coupling, thereby compensating the loss of a resonator in the OSC 103. Specifically, the negative resistance is provided by the transistors M3 and M4 to counteract a parasitic resistance of the resonator in the OSC 103, and enable the OSC 103 to maintain a stable oscillation, thereby outputting a first divided frequency differential signal $S_{f1}$ {OUT+, OUT−}.

Moreover, the buffer stage 105 may include transistors M5 and M6, inductors L3 and L4, capacitors C1 to C3, and an open-ended transmission line TL1. The transistors M5 and M6 may both be implemented by N-type transistors. Furthermore, a gate of the transistor M5 is coupled to the second end of the inductor L1, and a source of the transistor M5 is coupled to a ground potential. A gate of the transistor M6 is coupled to the second end of the inductor L2, and a source of the transistor M6 is coupled to the ground potential. A first end of the inductor L3 is coupled to a drain of the transistor M5, a first end of the inductor L4 is coupled to a drain of the transistor M6, and a second end of the inductor L4 is coupled to a second end of the inductor L3.

A first end of the capacitor C1 is coupled to the first end of the inductor L3, and a second end of the capacitor C1 is configured for outputting a boosted positive divided frequency signal OUT+'. A first end of the capacitor C2 is coupled to the first end of the inductor L4, and a second end of the capacitor C2 is configured for outputting a boosted negative divided frequency signal OUT−'. A first end of the open-ended transmission line TL1 is coupled to the operating voltage $V_{DD}$, and a second end of the open-ended transmission line TL1 is coupled to the second ends of the inductors L3 and L4. A first end of the capacitor C3 is coupled to the second end of the open-ended transmission line TL1, and a second end of the capacitor C3 is configured for outputting the second divided frequency signal $S_{f2}$.

In the exemplary embodiment, the open-ended transmission line TL1 has a property of K-fold frequency multiplication of L-wavelength, where K is a positive integer, and L is a natural number. Definitely, in other embodiments, a wideband RF choke circuit may also be used to replace the open-ended transmission line TL1. In addition, the transistors M5 and M6 are used as a buffer, to receive and boost the first divided frequency signal $S_{f1}$ (that is, OUT+' and OUT−'), thereby lowering the load effect. Furthermore, the inductors L3 and L4 are used as an output inductor of the buffer stage 105, and the capacitors C1-C3 are used as a capacitor for choking DC. It should be noted that in other embodiments, the transistors M3 to M6 may also be implemented by P-type transistors. However, the complementary circuit structure of the P-type and N-type transistors is well known to persons ordinarily skilled in the art, and thus is not further described in detail herein.

In practical operation of the ILFD 10, the transistors M1 and M2 in the signal injector 101 may be regarded as two mixers; and a band-pass filter is formed between the inductor L1 (L2), and the transistors M1 (M2), M3 (M4), and M5 (M6) (for example, a band-pass filter configured for selecting an angular frequency of $\omega_0$; however, the disclosure is not limited thereto). In addition, it is assumed that the open-ended transmission line TL1 has a property of frequency doubling of ¼ wavelength, and the ILFD 10 is intended to achieve a dual-mode output with divisors being 3 and 1.5, the working principle of the ILFD 10 may be as follows.

The first divided frequency signal $S_{f1}$ with an angular frequency of $\omega_0$ output from the ILFD 10 is mixed with the injection signal $S_{inj}$ with an angular frequency of $3\omega_0$ (for example, by the transistor M1), thereby generating angular frequencies of $2\omega_0$ and $4\omega_0$. Then, the injection signal $S_{inj}$ with the angular frequency of $3\omega_0$ is mixed with the angular frequencies of $2\omega_0$ and $4\omega_0$ (for example, by the transistor M2), thereby generating angular frequencies of $\omega_0$, $5\omega_0$, and $7\omega_0$. In this manner, after the selection by the band-pass filter formed between the inductor L1 (L2), and the transistors M1 (M2), M3 (M4) and M5 (M6), the ILFD 10 outputs the first divided frequency signal $S_{f1}$ with the angular frequency of $\omega_0$, and then feeds back the first divided frequency signal $S_{f1}$ to the transistor M1 equivalent to a mixer, so that a complete loop is formed, and the angular frequency of the first divided frequency signal $S_{f1}$ output from the ILFD 10 is fixed at $\omega_0$. Apparently, the ILFD 10 can achieve the effect of division by 3, that is, $3\omega_0 \div 3 = \omega_0$.

In addition, because the open-ended transmission line TL1 has the property of frequency doubling of ¼ wavelength, the open-ended transmission line TL1 forms, in response to the anti-symmetric positive and negative divided frequency signals OUT and OUT− provided by the OSC 103, a push-push circuit structure, such that the power of frequency doubling mostly falls on a load, so as to achieve the frequency doubling of the first divided frequency signal $S_{f1}$ with the angular frequency of $\omega_0$, thereby outputting the second divided frequency signal $S_2$ with the angular frequency of $2\omega_0$. Apparently, the ILFD 10 can also achieve the effect of division by 1.5, that is, $3\omega_0 \div 1.5 = 2\omega_0$.

It can be known that, the ILFD 10 can generate a dual-mode output (that is, the first divided frequency signal $S_{f1}$ with the angular frequency of $\omega_0$, and the second divided frequency signal $S_{f2}$ with the angular frequency of $2\omega_0$) in response to the same input frequency (that is, the injection signal $S_{inj}$), thereby enlarging the application range of the ILFD 10. In addition, there is a fractional-multiple relation (1.5 times) between the frequency of one mode of output (that is, the second divided frequency signal $S_{f2}$) and the input frequency (that is, the frequency of the injection signal $S_{inj}$), such that the ILFD 10 may be applied in a PLL and/or frequency synthesizer with a decimal divisor.

In the other exemplary embodiments, the fractional-multiple relation between the frequency of the second divided frequency signal $S_{f2}$ and that of the injection signal $S_{inj}$ can be changed simply by using a frequency multiplier having a frequency multiplication property to replace the open-ended transmission line TL1. For example, if the multiple of the used frequency multiplier is 1, the ILFD 10 can achieve the purpose of division by 3. In addition, if the used multiple of the frequency multiplier is 2, the ILFD 10 can achieve the purpose of division by 1.5. Furthermore, if the used multiple of the frequency multiplier is 3, the ILFD 10 can achieve the purpose of division by 1. The rest may be deduced by analogy.

Figure 3A:
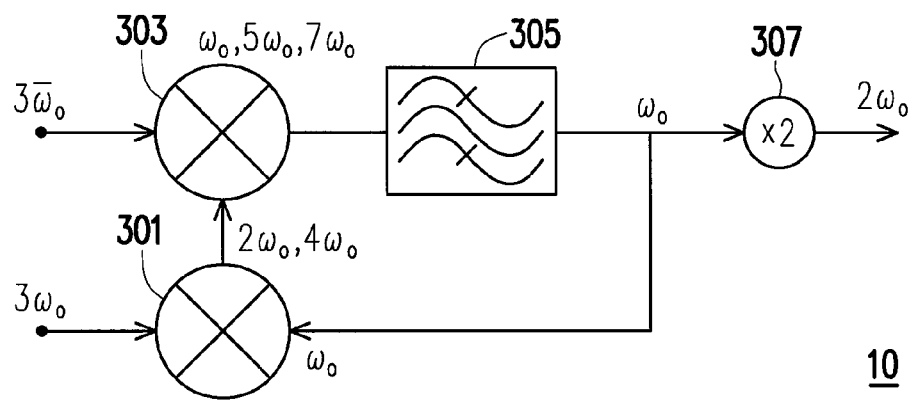
FIG. 3A is an equivalent circuit diagram illustrating an ILFD 10 according to an exemplary embodiment.
Figure 3B:
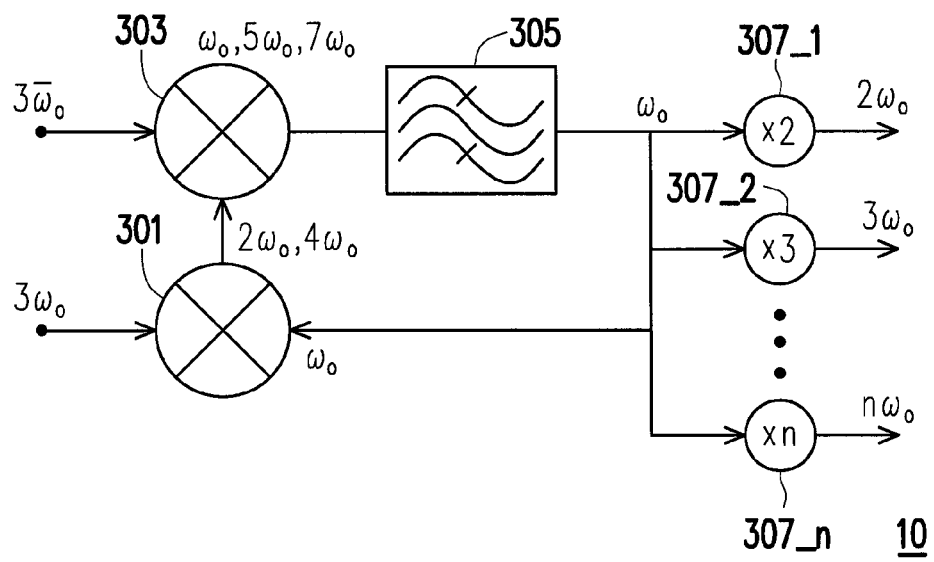
FIG. 3B is an equivalent circuit diagram illustrating an ILFD 10 according to another exemplary embodiment.

Accordingly, FIG. 3A is an equivalent circuit diagram illustrating an ILFD 10 according to an exemplary embodiment. Referring to FIG. 3A, the ILFD 10 shown in FIG. 3A may include mixers 301 and 303, a band-pass filter 305, and a frequency multiplier 307 which can be implemented by an open-ended transmission line having a property of frequency doubling, but not limited thereto, so that the multiple of the frequency multiplier 307 is 2. As such, the ILFD 10 may generate a dual-mode output (that is, angular frequencies of $\omega_0$ and $2\omega_0$) in response to the same input frequency (that is, angular frequencies $3\omega_0$ and $3\overline{\omega}_0$. Definitely, if the ILFD 10 further includes n frequency multipliers 307_1 to 307_n having different frequency multiplication properties (as shown in FIG. 3B), the ILFD 10 may generate an n-mode output (that is, angular frequencies of $\omega_0, 2\omega_0, 3\omega_0, 4\omega_0, \ldots$, and $n\omega_0$) in response to the same input angular frequency (that is, angular frequencies of $3\omega_0$ and $3\overline{\omega}_0$), thereby further enlarging the application range of the ILFD 10.

To sum up, in the exemplary embodiment, the transistors M1 and M2 are used to enhance the second harmonic component, so as to allow the ILFD 10 to achieve a wide-band injection locking range without requiring any additional DC power consumption, which can facilitate the application in a transceiver system of a mobile device for wireless communication. In addition, in the exemplary embodiment, the first divided frequency signal $S_{f1}$ is frequency doubled by using the open-ended transmission line TL1, so that the output of the ILFD 10 can achieve a dual-mode output, thereby enlarging the application range of the ILFD 10. Moreover, the wide-band property of the ILFD 10 may also be applied to frequencies specified by other different system specifications, including specifications such as communication system, automobile radar system, microwave and millimeter wave circuit system, and the circuit may be implemented by a low-cost silicon-based process, so as to increase the practicability, and the circuit may be widely applied in transceiver modules in the future.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An injection-locked frequency divider (ILFD), comprising:
    a signal injector, configured for receiving an injection signal;
    an oscillator (OSC), configured for dividing a frequency of the injection signal, so as to generate a first divided frequency signal, wherein there is an integral-multiple relation between a frequency of the first divided frequency signal and that of the injection signal; and
    a buffer stage, configured for receiving and boosting the first divided frequency signal, and performing a push-push process on the first divided frequency signal, so as to output a second divided frequency signal, wherein there is a fractional-multiple relation between a frequency of the second divided frequency signal and that of the injection signal.

2. The ILFD according to claim 1, wherein the injection signal is a differential injection signal comprising a first injection signal and a second injection signal, and the signal injector comprises:
    a first transistor, having a gate configured for receiving the first injection signal; and
    a second transistor, having a gate configured for receiving the second injection signal, and a source coupled to a source of the first transistor.

3. The ILFD according to claim 2, wherein the first divided frequency signal is a differential divided frequency signal comprising a positive divided frequency signal and a negative divided frequency signal, and the OSC comprises:
    a first inductor, having a first end coupled to an operating voltage, and a second end coupled to a drain of the first transistor, so as to output the positive divided frequency signal;
    a second inductor, having a first end coupled to the operating voltage, and a second end coupled to a drain of the second transistor, so as to output the negative divided frequency signal;
    a third transistor, having a gate coupled to the second end of the second inductor, a drain coupled to the second end of the first inductor, and a source coupled to a ground potential; and
    a fourth transistor, having a gate coupled to the second end of the first inductor, a drain coupled to the second end of the second inductor, and a source coupled to the ground potential.

4. The ILFD according to claim 3, wherein the buffer stage comprises:
    a fifth transistor, having a gate coupled to the second end of the first inductor, and a source coupled to the ground potential;
    a sixth transistor, having a gate coupled to the second end of the second inductor, and a source coupled to the ground potential;
    a third inductor, having a first end coupled to a drain of the fifth transistor;
    a fourth inductor, having a first end coupled to a drain of the sixth transistor, and a second end coupled to a second end of the third inductor;
    a first capacitor, having a first end coupled to the first end of the third inductor, and a second end configured for outputting the boosted positive divided frequency signal;
    a second capacitor, having a first end coupled to the first end of the fourth inductor, and a second end configured for outputting the boosted negative divided frequency signal;
    an open-ended transmission line, having a first end coupled to the operating voltage, and a second end coupled to the second ends of the third and fourth inductors; and
    a third capacitor, having a first end coupled to the second end of the open-ended transmission line, and a second end configured for outputting the second divided frequency signal.

5. The ILFD according to claim 4, wherein the first to sixth transistors are all N-type transistors.

6. The ILFD according to claim 1, wherein the ILFD is at least applicable in a phase-locked loop (PLL).

7. The ILFD according to claim 1, wherein the ILFD is at least applicable in a frequency synthesizer.

8. An injection-locked frequency divider (ILFD), configured for receiving an injection signal, dividing a frequency of the injection signal, so as to generate a first divided frequency signal, and performing a push-push process on the first divided frequency signal, so as to output a second divided frequency signal, wherein there is an integral-multiple relation between a frequency of the first divided frequency signal and that of the injection signal; and there is a fractional-multiple relation between a frequency of the second divided frequency signal and that of the injection signal.

9. The ILFD according to claim 8, wherein the injection signal is a differential injection signal; and the first divided frequency signal is a differential divided frequency signal.

10. The ILFD according to claim 8, wherein the ILFD is at least applicable in a phase-locked loop (PLL).

11. The ILFD according to claim 8, wherein the ILFD is at least applicable in a frequency synthesizer.

\* \* \* \* \*